(12) United States Patent
Hikavyy et al.

(10) Patent No.: US 11,545,357 B2
(45) Date of Patent: Jan. 3, 2023

(54) FORMATION OF A GA-DOPED SIGE AND B/GA-DOPED SIGE LAYERS

(71) Applicant: IMEC VZW, Leuven (BE)

(72) Inventors: Andriy Hikavyy, Haasrode (BE); Clement Porret, Kessel-Lo (BE)

(73) Assignee: IMEC VZW, Leuven (BE)

( * ) Notice: Subject to any disclaimer, the term of this patent is extended or adjusted under 35 U.S.C. 154(b) by 109 days.

(21) Appl. No.: 17/110,980

(22) Filed: Dec. 3, 2020

(65) Prior Publication Data
US 2021/0175069 A1 Jun. 10, 2021

(30) Foreign Application Priority Data
Dec. 6, 2019 (EP) .................. 19214064

(51) Int. Cl.
*H01L 21/02* (2006.01)
*H01L 29/16* (2006.01)
*H01L 29/78* (2006.01)

(52) U.S. Cl.
CPC .... *H01L 21/02532* (2013.01); *H01L 21/0257* (2013.01); *H01L 21/0262* (2013.01); *H01L 21/02381* (2013.01); *H01L 29/16* (2013.01); *H01L 29/7848* (2013.01)

(58) Field of Classification Search
CPC ........... H01L 21/0245; H01L 21/02521; H01L 21/02532; H01L 21/0257; H01L 21/02573; H01L 29/16; H01L 29/161; H01L 29/165; H01L 29/167; H01L 29/66015; H01L 29/7827; H01L 29/7842; H01L 29/7848; H01L 29/785; H01L 29/786; H01L 29/78642; H01L 21/02381; C23C 16/18; C23C 16/22; C23C 16/52

See application file for complete search history.

(56) References Cited

U.S. PATENT DOCUMENTS

| | | | |
|---|---|---|---|
| 9,799,736 | B1 | 10/2017 | Ebrish et al. |
| 9,972,682 | B2 | 5/2018 | Gluschenkov et al. |
| 2007/0207596 | A1 | 9/2007 | Kim et al. |
| 2011/0124169 | A1 | 5/2011 | Ye et al. |
| 2018/0286861 | A1 | 10/2018 | Choi et al. |
| 2019/0115451 | A1 | 4/2019 | Lee et al. |
| 2019/0157269 | A1 | 5/2019 | Koh et al. |
| 2019/0165174 | A1 | 5/2019 | Peng et al. |

OTHER PUBLICATIONS

Extended European Search Report and Written Opinion, EP Application No. 19214064.8, dated Jun. 9, 2020, 7 pages.
Wang, Lin-Lin, Hao Yu, Marc Schaekers, J-L. Everaert, Alexis Franquet, Bastien Douhard, L. Date et al. "Comprehensive study of Ga activation in Si, SiGe and Ge with 5×10-10 Ω• cm 2 contact resistivity achieved on Ga doped Ge using nanosecond laser activation." In 2017 IEEE International Electron Devices Meeting (IEDM), pp. 22-24. IEEE, 2017.

*Primary Examiner* — Cheung Lee
(74) *Attorney, Agent, or Firm* — McDonnell Boehnen Hulbert & Berghoff LLP

(57) ABSTRACT

A method for forming a Ga-doped SiGe layer comprises depositing, in the presence of a C-containing Ga precursor, Ga-doped SiGe on a substrate, thereby forming a first portion of the Ga-doped SiGe layer. The method further comprises depositing, in the absence of the C-containing Ga precursor, SiGe on the first portion, thereby forming a second portion of the Ga-doped SiGe layer.

18 Claims, 2 Drawing Sheets

FORMATION OF A GA-DOPED SIGE AND B/GA-DOPED SIGE LAYERS

CROSS-REFERENCE TO RELATED APPLICATIONS

The present application is a non-provisional patent application claiming priority to European Patent Application No. 19214064.8, filed Dec. 6, 2019, the contents of which are hereby incorporated by reference.

FIELD OF THE DISCLOSURE

This application relates to Ga-doped SiGe layers and fabrication thereof. Some aspects relate to Ga-doped SiGe layers that are B-doped. In particular, the application relates to fabrication of such layers comprising a co-deposition of Ga with Si, Ge, and in some cases also B.

BACKGROUND

Ga-doped SiGe is one of the most promising source/drain materials for advanced p-type metal-oxide-semiconductor (MOS) devices. Wang et al., for instance, demonstrated that sub $10^{-9}$ $\Omega \cdot cm^2$ contact resistivity can be achieved in Ti/SiGe:Ga stacks (WANG, Lin-Lin, et al. Comprehensive study of Ga activation in Si, SiGe and Ge with $5 \times 10^{-10}$ $\Omega \cdot cm^2$ contact resistivity achieved on Ga doped Ge using nanosecond laser activation. In: 2017 *IEEE International Electron Devices Meeting (IEDM)*. IEEE, 2017. p. 22.4.1-22.4. 4).

One way to manufacture Ga-doped SiGe is by epitaxial growth of SiGe:B (B-doped SiGe) followed by implantation of Ga with a subsequent anneal. However, such implantation of Ga leads to disruption of and damage to the existing SiGe:B lattice. Furthermore, the required post-implantation anneal is not always compatible with other semiconductor structures that are present in semiconductor devices that are being built.

An approach that addresses these concerns involves co-depositing Ga with Si, Ge, and B, thereby epitaxially growing SiGe:B:Ga (B/G-doped SiGe) directly without requiring any additional steps such as implantation and/or annealing. This approach is, for example, disclosed in US20190115451, in which a source/drain region is formed by a chemical vapor deposition process using a source gas and a doping gas. In this example, the source gas comprises a silicon precursor and a germanium precursor, and the doping gas comprises a gallium precursor and a boron precursor. The gallium precursor is an organometallic compound containing Ga.

Nevertheless, there is still a need in the art for a better way to form SiGe:Ga and SiGe:B:Ga (Ga-doped and B/Ga-doped SiGe) layers.

SUMMARY

Aspects of this application provide a method for forming SiGe:Ga and SiGe:B:Ga layers. Further aspects of the application provide SiGe:Ga and SiGe:B:Ga layers and SiGe:Ga and SiGe:B:Ga structures associated therewith. These aspects are accomplished by methods, SiGe:Ga and SiGe:B:Ga layers and structures disclosed herein.

In some embodiments, the concentration or percentage of contaminating C in at least the second portion of the SiGe:Ga and/or SiGe:B:Ga layers is low, e.g., lower than the concentration or percentage of contaminating C in a SiGe:Ga and SiGe:B:Ga layers based only on the first portion.

In an example embodiment, Si, Ge, and Ga can be relatively uniformly distributed throughout the SiGe:Ga layer. In an example embodiment, the concentrations (e.g., their bulk concentration) of dopants (e.g., Ga) is well defined.

In an example embodiment, Si, Ge, Ga, B, can be relatively uniformly distributed throughout the SiGe:B:Ga layer. In an example embodiment, the concentrations (e.g., their bulk concentration) of dopants (e.g., Ga and B) are well defined.

In example embodiments, the SiGe:Ga and/or SiGe:B:Ga layers have a low contact resistance with regard to its second portion, e.g., lower than the contact resistance for a SiGe:Ga and SiGe:B:Ga layers based only on the first portion. In example embodiments, the SiGe:Ga and SiGe:B:Ga layers have a low bulk resistance, e.g., lower than for a SiGe(:B):Ga layer based only on the first portion.

In an example embodiment, an area selective growth of the SiGe:Ga and SiGe:B:Ga layers can be achieved, e.g., on a semiconductor surface with respect to an oxide or nitride surface.

In an example embodiment, SiGe:Ga and/or SiGe:B:Ga structures (e.g., source/drain regions) with good electrical properties can be formed using the SiGe:Ga and/or SiGe:B:Ga layers.

In an example embodiment, the SiGe:Ga and/or SiGe:B:Ga structures can be realized in a relatively straightforward and economical fashion.

A first aspect relates to a method for forming SiGe:Ga layers comprising: (a) depositing, in the presence of a C-containing Ga precursor, SiGe:Ga on a substrate, thereby forming a first portion of the SiGe:Ga layer; and (b) depositing, in the absence of the C-containing Ga precursor, SiGe on the first portion, thereby forming a second portion of the SiGe:Ga.

Another aspect relates to a method for forming SiGe:B:Ga layers comprising: (a) depositing, in the presence of a C-containing Ga precursor, SiGe:B:Ga on a substrate, thereby forming a first portion of the SiGe:B:Ga layer; and (b) depositing, in the absence of the C-containing Ga precursor, SiGe:B on the first portion, thereby forming a second portion of the SiGe:B:Ga layer.

Another aspect relates to a SiGe:Ga layers comprising: (i) a first portion comprising a first concentration of C, (ii) a second portion on the first portion, the second portion comprising a second concentration of C. The second concentration is at least two times lower than the first concentration. In some examples, the second concentration is at least five times lower than the first concentration. In yet other examples, the second concentration is at least ten times lower than the first concentration.

Another aspect relates to a SiGe:B:Ga layers comprising: (i) a first portion comprising a first concentration of C, (ii) a second portion on the first portion, the second portion comprising a second concentration of C. The second concentration is at least two times lower than the first concentration. In some examples, the second concentration is at least five times lower than the first concentration. In yet other examples, the second concentration is at least ten times lower than the first concentration.

Another aspect relates to a method for forming a SiGe:Ga and/or SiGe:B:Ga structure for a semiconductor device comprising the method according to any embodiment of the first aspect.

Another relates to a SiGe:Ga and/or SiGe:B:Ga structure for a semiconductor device comprising the SiGe:Ga and/or SiGe:B:Ga layer according to any embodiment of the second aspect.

Particular and preferred aspects are set out in the accompanying independent and dependent claims. Features from the dependent claims may be combined with features of the independent claims and with features of other dependent claims as appropriate and not merely as explicitly set out in the claims.

Although there has been constant improvement, change, and evolution of devices in this field, the present concepts are believed to represent substantial new and novel improvements, including departures from prior practices, resulting in the provision of more efficient, stable, and reliable devices of this nature.

The above and other characteristics, features, and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE FIGURES

The above, as well as additional features, will be better understood through the following illustrative and non-limiting detailed description of example embodiments, with reference to the appended drawings.

Figure 1:
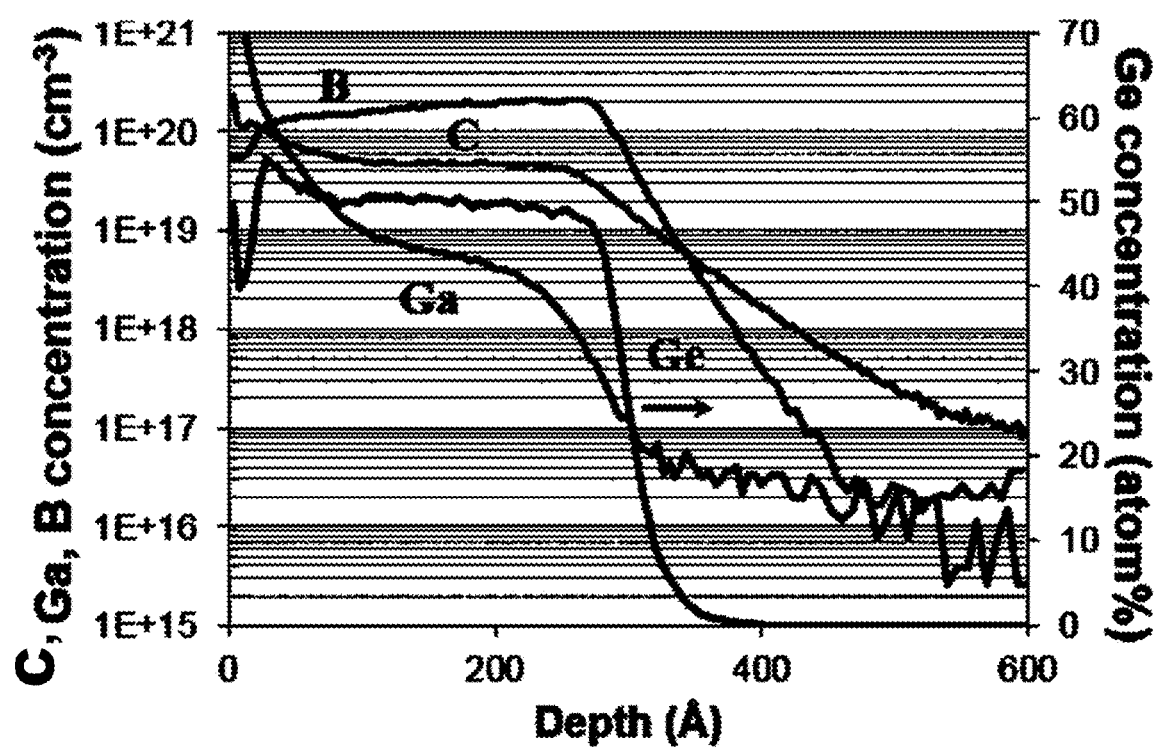
FIG. 1 shows a secondary-ion mass spectrometry profile, in accordance with a first example embodiment.

All the figures are schematic, not necessarily to scale, and generally only show parts that are necessary to elucidate example embodiments, wherein other parts may be omitted or merely suggested. The same reference signs refer to the same or analogous elements.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Furthermore, terms such as first, second, third, and the like in the description and in the claims are used for distinguishing between similar elements and not necessarily for describing a sequence, either temporally, spatially, in ranking, or in any other manner. It is to be understood that the terms so used are interchangeable under appropriate circumstances and that the embodiments described herein are capable of operation in other sequences than described or illustrated herein.

Moreover, the terms such as over, under, and the like in the description and the claims are used for descriptive purposes and not necessarily for describing relative positions. It is to be understood that the terms so used are interchangeable with their antonyms under appropriate circumstances and that the embodiments described herein are capable of operation in other orientations than described or illustrated herein.

It is to be noticed that the term "comprising," used in the claims, should not be interpreted as being restricted to the means listed thereafter; the term does not exclude other elements or steps. It is thus to be interpreted as specifying the presence of the stated features, integers, steps, or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent to one of ordinary skill in the art from this disclosure, in one or more embodiments.

Similarly, it should be appreciated that in the description of exemplary embodiments, various features are sometimes grouped together in a single embodiment, figure, or description thereof for the purpose of streamlining the disclosure and aiding in the understanding of one or more of the various aspects. This method of disclosure, however, is not to be interpreted as reflecting an intention that the embodiments require more features than are expressly recited in each claim. Rather, as the following claims reflect, various aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the claims and form different embodiments, as would be understood by those in the art. For example, in the following claims, any of the claimed embodiments can be used in any combination.

In the description provided herein, numerous specific details are set forth. However, it is understood that the embodiments may be practiced without these specific details. In other instances, well-known methods, structures, and techniques have not been shown in detail in order not to obscure an understanding of this description.

Reference will be made to transistors. These are devices having a first main electrode such as a drain, a second main electrode such as a source, and a control electrode such as a gate for controlling the flow of electrical charges between the first and second main electrodes.

The following terms are provided solely to aid in the understanding of the disclosure.

As used herein, and unless otherwise specified, the terms "Si," "Ge," "B," and "Ga" represent the chemical elements silicon, germanium, boron, and gallium, respectively. Further, a colon ":" preceding an element indicates that the element corresponds to a doping element. Thus, the expression SiGe:B:Ga represents a SiGe compound that is B doped and Ga doped. The expression SiGe:Ga represents a SiGe compound that is Ga doped.

As used herein, and unless otherwise specified, an organometallic compound is a chemical compound comprising at least one chemical bond between a carbon atom, typically of an organic moiety, and a metal or metalloid.

As used herein, and unless otherwise specified, a metalorganic compound is a chemical compound comprising at least one metal or metalloid and an organic ligand. In contrast to organometallic compounds, metalorganic compounds thus lack a direct metal-carbon bond.

The above notwithstanding, it can be noted that, although the above-described definitions are in line with how these terms have been used traditionally, "organometallic" and "metalorganic" are occasionally used interchangeably in the art, in which case they may refer to organometallic compounds, metalorganic compounds or both.

As used herein, and unless otherwise specified, the term "source/drain" is understood as a source and/or a drain. Likewise, the term "source/drain entity" (e.g., source/drain region) is understood as a source entity and/or a drain entity (e.g., source region and/or drain region). In embodiments, a source and a drain may be comparable (e.g., indistinguishable) and their designation may depend on a relative voltage difference that is put across them in the final semiconductor device.

A first aspect relates to a method for forming a SiGe:Ga layer. The method comprises (a) depositing, in the presence of a C-containing Ga precursor, SiGe:Ga on a substrate, thereby forming a first portion of the SiGe:Ga layer; and (b) depositing, in the absence of the C-containing Ga precursor, SiGe on the first portion, thereby forming a second portion of the SiGe:Ga a layer. As previously described, the SiGe:Ga layer, SiGe:Ga deposited in step (a), and SiGe deposited in step (b) can alternatively be referred to as a Ga-doped SiGe layer or Ga-doped SiGe.

Another aspect relates to a method for forming a SiGe:B:Ga layer. The method comprises (a) depositing, in the presence of a C-containing Ga precursor, SiGe:B:Ga on a substrate, thereby forming a first portion of the SiGe:B:Ga layer; and (b) depositing, in the absence of the C-containing Ga precursor, SiGe:B on the first portion, thereby forming a second portion of the SiGe:B:Ga layer. As previously described, the SiGe:B:Ga layer, SiGe:B:Ga deposited in step (a), and SiGe:B deposited in step (b) can alternatively be referred to as a B/Ga-doped SiGe layer or B/Ga-doped SiGe.

It was surprisingly found that the first portion can act as a Ga reservoir from which Ga can segregate into the second portion, while simultaneously restraining the C to the first portion. In this way, a SiGe:Ga and/or SiGe:B:Ga layer can be formed where the Ga is distributed throughout both the first and second portions, but where the C, which has a negative impact on the contact and bulk resistivity, is restricted to the first portion. The resulting SiGe:Ga and/or SiGe:B:Ga layer thus shows an improved contact resistivity, at the least for the contact resistivity with respect to the second portion, and in some examples, an improved bulk resistivity overall.

The aspects disclosed herein are not necessarily limited to any specific substrate. Nevertheless, a substrate which allows epitaxial growth of the SiGe:Ga and/or SiGe:B:Ga layer thereon may, in some example embodiments, be desirable. Moreover, in view of the desired use of the SiGe:Ga and/or SiGe:B:Ga layer (e.g., in a source/drain region), the substrate may commonly be a semiconductor substrate (e.g., an Si substrate) or may comprise at least a semiconductor surface (e.g., a Si surface). In such cases, the SiGe:Ga and/or SiGe:B:Ga layer may be grown (e.g., area selectively; cf. infra) on the Si surface.

In embodiments, the SiGe may be $Si_{1-x}Ge_x$ with x between 0.25 to 0.75. In some examples, x is between 0.4 and 0.6, such as 0.5.

The aspects disclosed herein are not particularly limited to a specific deposition technique as long as a C-containing Ga precursor is used therein. Notwithstanding, the deposition in step (a) and/or step (b) may, in some embodiments, comprise an epitaxial process. In embodiments, the epitaxial process may be a chemical vapor deposition (CVD), e.g., metalorganic CVD (MOCVD) or plasma-enhanced CVD (PECVD), or a molecular beam epitaxy (MBE), e.g., metalorganic MBE (MOMBE). In embodiments, the epitaxial process may be laser-assisted (e.g., laser-assisted MOMBE).

In embodiments, the deposition in step (a) and/or step (b) may be performed at a temperature of 450° C. or below, such as from 400 to 350° C. The deposition can thus be performed at a relatively low temperature, thereby making the method compatible.

In embodiments, step (a) may be performed using a Si precursor, a Ge precursor, a B precursor, and the C-containing Ga precursor. In embodiments, step (b) may comprise continuing the deposition of step (a) without the C-containing Ga precursor. Step (b) may, for example, comprise turning off the C-containing Ga precursor flow while maintaining the flows of the Si, and Ge, and/or the flows of Si, Ge, and B precursors.

In embodiments, the Si precursor may be a silane (e.g., $Si_xH_y$). The silane may be a monosilane (e.g., $SiH_4$), or a higher order silane such as a disilane (e.g., $Si_2H_6$), trisilane (e.g., $Si_3H_8$), tetrasilane (e.g., $Si_4H_{10}$), pentasilane (e.g., hexasilane (e.g., $Si_6H_{14}$), etc. In embodiments, the Ge precursor may be a germane (e.g., $Ge_xH_y$). The germane may be a monogermane (e.g., $GeH_4$), or a higher order germane such as a digermane (e.g., $Ge_2H_6$), trigermane (e.g., $Ge_3H_8$), tetragermane (e.g., $Ge_4H_{10}$), pentagermane (e.g., $Ge_5H_{12}$), hexagermane (e.g., $Ge_6H_{14}$), etc. In some embodiments, the Si precursor may be a higher order silane and/or the Ge precursor may be a higher order germane. Lower growth temperatures can be used when using higher order precursors. Indeed, while this is less of a problem for monogermane, in particular, monosilane by itself necessitates the use of relatively high temperatures before growth can occur. However, in combination with a higher order germane, the growth kinetics change and SiGe growth at relatively low temperatures (e.g., 450° C. or below, cf. supra) becomes possible, especially for higher Ge contents (e.g., $Si_{1-x}Ge_x$ with x≥0.4, e.g., x≥0.6). The use of at least one higher order Si or Ge precursor will thus ensure that low temperature growth can be achieved. In embodiments, the B precursor may be a borane (e.g., $B_xH_y$), and in some examples, may be a diborane (e.g., $B_2H_6$). Note that, although only unsubstituted linear forms have been mentioned as examples above, the silane, germane, and/or borane may in general also be branched, cyclic, and/or may comprise one or more side chains (e.g., alkyl or aryl side chains) replacing one or more H atoms.

In embodiments, the C-containing Ga precursor may be an organometallic or metalorganic Ga compound. The C-containing Ga precursor may, for example, be an alkyl-gallium, such as trimethylgallium (TMGa), triethylgallium (TEGa), or tri-isobutylgallium (TTBGa).

In embodiments, the method may comprise a further step (c), after step (a) and/or after step (b), of (c) etching back the SiGe:Ga and/or SiGe:B:Ga layer. In embodiments, step (c) may be performed using a Cl-based etchant (e.g., $Cl_2$). In some embodiments, step (c) may be performed after step (b). For example, step (c) may be performed after each of step (a) and step (b) (i.e., the sequence of steps may be (a)-(c)-(b)-(c)). In embodiments, the method may be for area selectively forming the SiGe:Ga and/or SiGe:B:Ga layer on a semiconductor (e.g., Si) surface with respect to an oxide or nitride surface. In embodiments, step (c) may comprise removing 5 nm or less of SiGe:Ga and/or SiGe:B:Ga present on the semiconductor surface. In some examples, 2 nm, 1 nm, or less than 1 nm, is removed, while removing SiGe:Ga and/or SiGe:B:Ga present on the oxide or nitride surface entirely. In embodiments, a vent step may be performed after, or at the end of, step (c). The vent step facilitates removal of the remaining etchant, thereby ensuring that etchant is no longer present during the next step (e.g., the next deposition step).

It was further surprisingly discovered that performing the deposition in the presence of a Cl-based etchant, as may be done when area selectively growing a SiGe and/or SiGe:B layer without Ga, is in the present case problematic, because the Cl reacts with the Ga and in doing so hinders the inclusion of Ga into SiGe:Ga and SiGe:B:Ga layers. Rather than performing them concurrently, the deposition and etching may thus be separated into distinct steps. An area selective growth can thereby be realized because the SiGe:Ga and SiGe:B:Ga etching rate is faster over some surfaces (e.g., SiGe:Ga or SiGe:B:Ga deposited on an oxide or nitride surface) than others (e.g., SiGe:Ga or SiGe:B:Ga deposited on a semiconductor surface), thus allowing to form the SiGe:Ga or SiGe:B:Ga layer selectively on the latter.

In embodiments, a sequence comprising steps (a), (b), and, if present, (c) may be repeated at least two times. One way in which an arbitrary layer thickness can be achieved for the SiGe:Ga and/or SiGe:B:Ga layer is by multiple cycles of alternately depositing the first and the second portions. If desired, the step of etching back the SiGe:Ga or SiGe:B:Ga layer can also be included in these cycles to realize an area selectively formed SiGe:Ga or SiGe:B:Ga layer of arbitrary thickness.

In embodiments, any feature of any embodiment of the first aspect may independently be as correspondingly described for any embodiment of any of the other aspects.

Another aspect relates to a SiGe:Ga layer comprising: (i) a first portion comprising a first concentration of C, (ii) a second portion on the first portion, the second portion comprising a second concentration of C; wherein the second concentration is at least two, five or even ten times lower than the first concentration. As previously described, the SiGe:Ga layer can alternatively be referred to as a Ga-doped SiGe layer.

Another aspect relates to a SiGe:B:Ga layer comprising: (i) a first portion comprising a first concentration of C, (ii) a second portion on the first portion, the second portion comprising a second concentration of C; wherein the second concentration is at least two, five or even ten times lower than the first concentration. As previously described, the SiGe:B:Ga layer can alternatively be referred to as a B/Ga-doped SiGe layer In embodiments, the second portion may be in direct physical contact with the first portion.

In embodiments, the first and second concentrations may be average layer concentrations (e.g., bulk concentrations). In embodiments, a local C concentration profile may change abruptly (e.g., discontinuously) when going from the first to the second portion.

In embodiments, a thickness of the first portion may be from 0.05 to 20 times a thickness of the second portion, from 0.1 to 10 times a thickness of the second portion, from 0.2 to 5 times a thickness of the second portion, from 0.3 to 3 times a thickness of the second portion, from 0.5 to 2 times a thickness of the second portion. In some examples, the thickness of the first portion and the second portion are substantially equal in thickness. The first and second portions may have a similar thickness or at least a thickness within the same order of magnitude. In embodiments, a thickness of the first portion and/or a thickness of the second portion may be from 1 to 50 nm, from 2 to 25 nm, from 3 to 15 nm, or from 5 to 10 nm. Since the C is contained in the first portion, there may be a strive to keep the thickness of that portion to a minimum (while maximizing the thickness of the second portion). Nevertheless, it may be desirable to balance this aspect with the function of the first layer as a Ga-reservoir and thus the need to incorporate sufficient Ga into that layer, so as to reach the desired concentration of Ga in the final SiGe:Ga or SiGe:B:Ga layer (i.e., after segregation).

In embodiments, a thickness of the SiGe:Ga or SiGe:B:Ga layer may be from 1 to 100 nm, from 5 to 75 nm, or from 25 to 60 nm. For instance, an example of the SiGe:Ga and/or SiGe:B:Ga layer has a thickness of 50 nm.

In some embodiments, the SiGe:Ga and/or SiGe:B:Ga layer may comprise a layer stack of alternating first and second portions. In embodiments, the first and second portions may be in direct physical contact with one another. In such a layer stack, the Si, Ge, Ga, (or the Si, Ge, Ga, and B) may be relatively uniformly distributed throughout the stack (e.g., their respective concentration may be relatively constant), while the C concentration fluctuates through the high-C first portions and low-C second portions. In embodiments, the local C concentration profile may change abruptly (e.g., discontinuously) when going from the first to the second portion and again when going from the second portion to a further first portion.

In other embodiments, the SiGe:Ga and/or SiGe:B:Ga layer may comprise a single second portion on a single first portion. For some applications, the plurality of alternating first and second portions, the fluctuating C concentration, and/or the numerous interfaces between the portions, could have a negative effect on some layer property that is of interest (e.g., on the bulk resistivity). In such cases, only a single first and second portion may be grown. Since the contact resistance is typically determined by the layer properties near the contact (e.g., within a few nm from the contact interface), a relatively thin low-C second portion can already result in a better contact resistance. The rest of the SiGe:Ga and/or SiGe:B:Ga layer can then be made up by the first portion, thereby keeping the number of interfaces and C fluctuations low.

In embodiments, any feature of any embodiment of the second aspect may independently be as correspondingly described for any embodiment of any of the other aspects.

Another aspect relates to a method for forming a SiGe:Ga and/or SiGe:B:Ga structure for a semiconductor device, comprising the method according to any embodiment of the first aspect.

In embodiments, the semiconductor device may be a field effect transistor (FET), e.g., a complementary metal-oxide-semiconductor (CMOS) field effect transistor (CMOS-FET).

In embodiments, the method may further comprise etching (e.g., patterning) the SiGe:Ga and/or SiGe:B:Ga layer to form the SiGe:Ga and/or SiGe:B:Ga structure.

In embodiments, the method may further comprise forming a further structure (e.g., a source/drain contact) on the SiGe:Ga and/or SiGe:B:Ga structure.

In embodiments, any feature of any embodiment of the third aspect may independently be as correspondingly described for any embodiment of any of the other aspects.

Another aspect relates to a SiGe:Ga structure for a semiconductor device, comprising the SiGe:Ga layer according to any embodiment of the second aspect.

Another aspect relates to a SiGe:B:Ga structure for a semiconductor device, comprising the SiGe:B:Ga layer according to any embodiment of the second aspect.

In embodiments, the SiGe:Ga and/or SiGe:B:Ga structure may be comprised in (e.g., may be) a source/drain region.

In embodiments, a further structure (e.g., a source/drain contact) may be in contact with the SiGe:Ga and/or SiGe:B:Ga structure. In embodiments, the further structure may be in electrical contact with or in direct physical contact with (e.g., on) the SiGe:Ga and/or SiGe:B:Ga structure. In embodiments, the further structure may be in contact with the second portion of the SiGe:Ga and/or SiGe:B:Ga structure. The second portion may have a lower contact resistance than the first portion.

In embodiments, the SiGe:Ga and/or SiGe:B:Ga structure may be on a semiconductor surface (e.g., a Si surface).

In embodiments, any feature of any embodiment of the fourth aspect may independently be as correspondingly described for any embodiment of any of the other aspects.

A detailed description of several embodiments will now be described. It is clear that other embodiments can be configured according to the knowledge of the person skilled in the art without departing from the true technical teaching disclosed herein.

In a comparative example, a SiGe:B:Ga layer was formed by co-depositing Si, Ge, B, and Ga in an epitaxial process. The epitaxial process (e.g., a chemical vapor deposition (CVD)) was performed at relatively low temperature (e.g., 450° C. and below) in $H_2$ as carrier gas (about 10-50 standard liter per minute (SLM)) at a reduced pressure of about 10-50 Torr. In order to promote a high growth rate (e.g., above 10 nm/min) and efficient Ga incorporation (i.e., keeping the amount of Ga segregation in check), a higher order silane and germane were used as Si and Ge precursors. More particularly, the Si precursor flow was pure disilane, and the Ge precursor flow was a few percent of digermane diluted in $H_2$. The Si and Ge precursor flows were in the range of about 100 to 1000 standard cubic centimeters per minute (SCCM), with the ratio between both being such that $Si_{1-x}Ge_x$ was grown with x being equal to about 50%. To realize the co-deposition, flows of diborane as B precursor and triethylgallium (TeGa) as organometallic Ga precursor, both about 0.1 SCCM, were added to the growing chemistry alongside the aforementioned Si and Ge precursor flows. The achieved SiGe:B:Ga growth rate was above 10 nm/min.

A secondary-ion mass spectrometry profile of the resulting SiGe:B:Ga layer is shown in FIG. 1. As can be seen, a fairly uniform distribution of Ge (about 50%) and B (about $2\times10^{20}$ $cm^{-3}$), and Ga with limited segregation was achieved. However, because an organometallic Ga precursor was used, as in US20190115451, a significant amount of C (about $5\times10^{19}$ $cm^{-3}$) was also incorporated; which in turn has a negative impact on the physical properties (e.g., bulk and contact resistivity) of the SiGe:B:Ga layer.

In another comparative example, a layer was formed by first co-depositing Si, Ge, B, and Ga to form a first portion and subsequently co-depositing only Si and Ge to form a second portion. This was achieved by first switching on all four precursor flows as described in example 1 to grow the first portion (e.g., to a thickness of about 5-10 nm) and then switching off both the B precursor and Ga precursors flows, while maintaining the Si precursor and Ge precursor flows, when growing the second portion (e.g., also to a thickness of about 5-10 nm).

Figure 2:
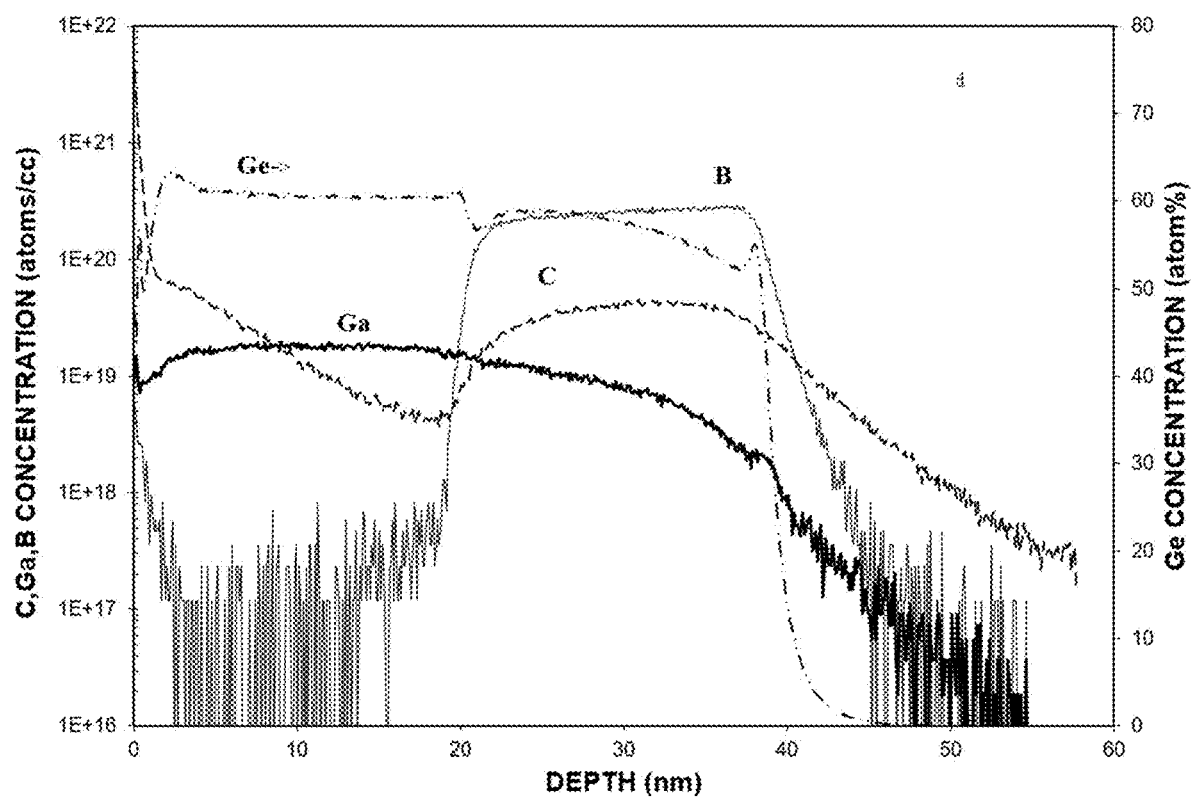
FIG. 2 shows a secondary-ion mass spectrometry profile, in accordance with a second example embodiment.

A secondary-ion mass spectrometry profile of the resulting layer is shown in FIG. 2. Like example 1, a fairly uniform distribution of Ge (here about 60%) was observed. Moreover, a uniform Ga distribution throughout the first and second portions was achieved with even a reduced surface segregation as compared to FIG. 1. By contrast, the C and B concentrations in the second portion are drastically reduced. Note in this respect that the high C concentration near the surface and the associated tail is an artifact of the measurement technique due to C-containing contaminants (e.g., organic compounds), which are present on the surface and is not due to C, which is actually incorporated in the second portion, as such, the drop-off around 18 nm is more reflective of the actual C-content in the second portion. As such, while switching off the B precursor and organometallic Ga precursor upon growing the second portion significantly reduces the amount of B and C in the second portion, it was surprisingly observed that the first portion acts akin to a reservoir for Ga and that, although the organometallic Ga precursor is not present while growing the second portion, Ga segregation from the first to the second portion anyway results in a good (and possibly even better) Ga distribution throughout both layers. Moreover, since the C incorporation is substantially restricted to the first portion, at least the contact resistivity with respect to the second portion is not or less negatively affected. It is furthermore expected that a similar consideration likely applies to the bulk resistivity of the layer as a whole.

Figure 3:
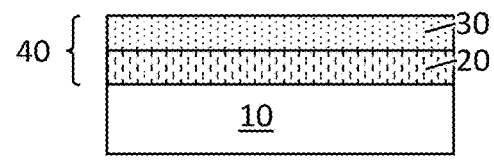
FIG. 3 depicts a first SiGe:B:Ga layer, in accordance with an example embodiment.

Example 2 is repeated, but only the organometallic Ga precursor flow is switched off while growing the second portion, thus maintaining the Si precursor, Ge precursor, and B precursor flows. A SiGe:B:Ga layer is obtained, which is similar to the layer in example 2, but with a relatively constant B concentration throughout the first and second portions, as in example 1. Such a SiGe:B:Ga layer 40, with a first portion 20 and a second portion 30 on a substrate 10, is schematically depicted in FIG. 3. Optimization of the growth conditions for the first and second portion can allow to further control the doping concentrations (e.g., uniform doping) of B and Ga, while minimizing C, as desired, thereby tuning, e.g., the bulk and contact resistivity of the SiGe:B:Ga layer.

Figure 4:
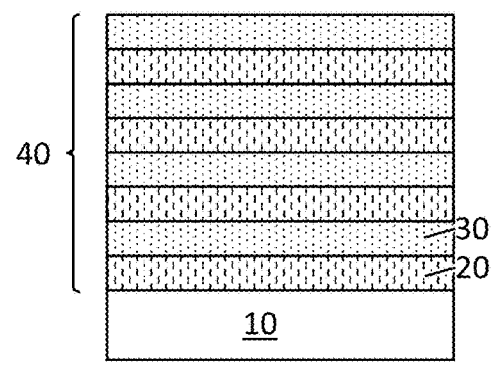
FIG. 4 depicts a second SiGe:B:Ga layer, in accordance with an example embodiment.

On a SiGe:B:Ga layer such as obtained from example 3a, the cycle of depositing the first and second portions is repeated several times. A SiGe:B:Ga layer of a desired arbitrary thickness is thereby obtained comprising a layer stack of alternating first and second portions. Such a SiGe:B:Ga layer 40, with first portions 20 and second portions 30 on a substrate 10, is schematically depicted in FIG. 4. Optimization of the growth conditions of the different first and second portions can allow to further control the doping concentrations (e.g., uniform doping) of B and Ga, while minimizing C, as desired, thereby tuning, e.g., the bulk and contact resistivity of the SiGe:B:Ga layer.

Example 3a is repeated, but an additional etching step with a $Cl_2$ etchant is introduced after depositing the second portion. Depending on the nature of the substrate underneath the SiGe:B:Ga, the etching rate is faster or slower. For example, the SiGe:B:Ga etching rate over a nitride or oxide material is faster than that over a semiconductor (e.g., Si) surface. In this way, an area selective SiGe:B:Ga deposition on a semiconductor surface, with respect to nitride or oxide material, can be realized by growing the SiGe:B:Ga on both surfaces and then etching it back to remove it again over the nitride or oxide material.

Likewise, in order to area selectively grow a SiGe:B:Ga layer to a desired arbitrary thickness, the deposition, and etching steps can be cycled by performing an etching after deposition of each second portion in example 3b.

While some embodiments have been illustrated and described in detail in the appended drawings and the foregoing description, such illustration and description are to be considered illustrative and not restrictive. For example, any formulas given above are merely representative of procedures that may be used. Functionality may be added or deleted from the block diagrams and operations may be interchanged among functional blocks. Steps may be added or deleted to methods described herein. Other variations to the disclosed embodiments can be understood and effected in practicing the claims from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a Ga-doped SiGe layer comprising:
    depositing, in a presence of a C-containing Ga precursor, Ga-doped SiGe on a substrate, thereby forming a first portion of the Ga-doped SiGe layer, wherein the Ga-doped SiGe layer is area selectively deposited on a semiconductor surface with respect to an oxide or nitride surface;
    depositing, in absence of the C-containing Ga precursor, SiGe on the first portion, thereby forming a second portion of the Ga-doped SiGe layer: and
    after depositing of the Ga-doped SiGe or after depositing of the SiGe, etching back the Ga-doped SiGe layer.

2. The method according to claim 1, wherein the first portion of the Ga- doped SiGe layer and the second portion of the Ga-doped SiGe layer are B-doped.

3. The method according to claim 2, wherein the depositing of the Ga- doped SiGe is performed using a Si precursor, a Ge precursor, a B precursor, and the C-containing Ga precursor, and wherein the depositing of the SiGe comprises continuing the depositing of the Ga-doped SiGe without the C-containing Ga precursor.

4. The method according to claim 1, wherein one or both of the depositing of the Ga-doped SiGe and the depositing of the Ga-doped SiGe comprises an epitaxial process.

5. The method according to claim 1, wherein the depositing of the Ga-doped SiGe is performed using a Si precursor, a Ge precursor, and the C-containing Ga precursor, and wherein the depositing of the SiGe comprises continuing the depositing of the Ga-doped SiGe without the C-containing Ga precursor.

6. The method according to claim 1, wherein one or both of the depositing of the Ga-doped SiGe and the depositing of the SiGe is performed at a temperature of 450° C. or below.

7. The method according to claim 1, wherein one or both of the Si precursor is a higher order silane and the Ge precursor is a higher order germane.

8. The method according to claim 1, wherein etching back the Ga-doped SiGe layer is performed using a Cl-based etchant.

9. The method according to claim 1, wherein a sequence comprising depositing of the Ga-doped SiGe, depositing of the SiGe, and etching back the Ga-doped SiGe layer is repeated at least two times.

10. A method for forming a Ga-doped SiGe structure for a semiconductor device comprising the method according to claim 1.

11. A Ga-doped SiGe layer comprising:
    a first portion comprising a first concentration of C, wherein the first portion is area selectively deposited on a semiconductor surface with respect to an oxide or nitride surface, wherein the first portion is at least partially etched back; and
    a second portion on the first portion, the second portion comprising a second concentration of C,
    wherein the first concentration of C is at least double the second concentration of C.

12. The Ga-doped SiGe layer according to claim 11, wherein the Ga-doped SiGe layer is B-doped.

13. The Ga-doped SiGe layer according to claim 11, wherein a thickness of the first portion is from 0.05 to 20 times a thickness of the second portion.

14. The Ga-doped SiGe layer according to claim 11, wherein a thickness of the first portion is from 0.1 to 10 times a thickness of the second portion.

15. The Ga-doped SiGe layer according to claim 11, wherein a thickness of the first portion and a thickness of the second portion is from 1 to 50 nm.

16. The Ga-doped SiGe layer according to claim 11, wherein a thickness of the first portion or a thickness of the second portion is from 2 to 25 nm.

17. A Ga-doped SiGe structure for a semiconductor device comprising the Ga-doped SiGe layer according to claim 13.

18. The Ga-doped SiGe structure according to claim 17, wherein the Ga-doped SiGe structure corresponds to a source region or a drain region.

* * * * *